(12) United States Patent
Taguchi et al.

(10) Patent No.: US 10,314,210 B2
(45) Date of Patent: Jun. 4, 2019

(54) ELECTRICAL UNIT INCLUDING BATTERY AND INVERTER WITH COOLING

(71) Applicant: SUBARU CORPORATION, Tokyo (JP)

(72) Inventors: Takumi Taguchi, Tokyo (JP); Tomoya Sato, Tokyo (JP); Yuki Natsume, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 0 days.

(21) Appl. No.: 15/611,533

(22) Filed: Jun. 1, 2017

(65) Prior Publication Data

US 2018/0035573 A1    Feb. 1, 2018

(30) Foreign Application Priority Data

Jul. 26, 2016    (JP) ................. 2016-146737

(51) Int. Cl.
*H05K 7/20* (2006.01)
*B60K 6/22* (2007.10)
(Continued)

(52) U.S. Cl.
CPC .......... *H05K 7/20909* (2013.01); *B60L 58/26* (2019.02); *B60K 6/22* (2013.01);
(Continued)

(58) Field of Classification Search
CPC ............. Y10S 903/902; Y10S 903/903; Y10S 903/907; Y10S 903/904; B60K 6/48; B60K 1/04; B60K 2001/003; B60K 11/02; B60K 11/06; B60K 6/22; B60Y 2200/92; B60Y 2300/91; B60Y 2400/112; B60Y 2400/61; B60Y 2200/91; B60Y 2306/05; H05K 7/209; H05K 7/20909; H05K 7/1432; B60L 11/1874

See application file for complete search history.

(56) References Cited

U.S. PATENT DOCUMENTS 7,051,825 B2 *   5/2006   Masui ................. B60K 1/04
                                                              180/65.1
2007/0000231 A1   1/2007   Otsuka et al.
(Continued)

FOREIGN PATENT DOCUMENTS

| JP | 2007-008403 A | 1/2007 |
| JP | 2008-062780 A | 3/2008 |
| JP | 2010-041809 A | 2/2010 |

OTHER PUBLICATIONS

Japanese Office Action dated May 8, 21018 in Japanese Application No. 2016-146737 with an English translation thereof.

*Primary Examiner* — Adam B Dravininkas
(74) *Attorney, Agent, or Firm* — McGinn I. P. Law Group, PLLC (57) ABSTRACT

An electrical unit includes a casing, a cooling channel, a second inverter, and a heat transfer member. The casing contains a battery. The cooling channel is formed in the casing and adjacent to the battery or a first inverter. A cooling medium flows in the cooling channel. The second inverter is disposed in the casing apart from the cooling channel. The heat transfer member extends from the cooling channel or an outer wall of the cooling channel to the second inverter.

20 Claims, 9 Drawing Sheets

(51) Int. Cl.
*B60L 58/26* (2019.01)
*B60K 1/00* (2006.01)

(52) U.S. Cl.
CPC ..... *B60K 2001/005* (2013.01); *B60Y 2200/91* (2013.01); *B60Y 2200/92* (2013.01); *B60Y 2306/05* (2013.01); *B60Y 2400/61* (2013.01); *Y10S 903/904* (2013.01)

(56) References Cited

U.S. PATENT DOCUMENTS

| | | | |
|---|---|---|---|
| 2008/0062622 A1* | 3/2008 | Fukazu | B60K 1/04 361/678 |
| 2010/0188813 A1* | 7/2010 | Nakatsu | H02M 7/003 361/689 |
| 2010/0188814 A1* | 7/2010 | Nakatsu | H02M 7/003 361/689 |
| 2012/0299407 A1* | 11/2012 | Miyama | H02K 5/18 310/63 |
| 2014/0299393 A1* | 10/2014 | Matsuda | B62J 9/00 180/65.1 |
| 2015/0289391 A1* | 10/2015 | Nakatsu | H05K 5/0026 361/796 |
| 2016/0372805 A1* | 12/2016 | Kim | H01M 10/6556 |

* cited by examiner

ELECTRICAL UNIT INCLUDING BATTERY AND INVERTER WITH COOLING

CROSS REFERENCE TO RELATED APPLICATIONS

The present invention contains subject matter related to Japanese Patent Application No. 2016-146737 filed in the Japan Patent Office on Jul. 26, 2016, the entire contents of which are incorporated herein by reference.

BACKGROUND

1. Technical Field

The present invention relates to an electrical unit in which a cooling channel is formed.

2. Related Art

Electrical units, such as a battery unit, are mounted in vehicles driven by a motor, such as electric automobiles and hybrid automobiles. A battery and an inverter are disposed in a casing of the electrical unit. For example, an airflow path (cooling channel) is formed as a suction fan sucks air into the casing, and the battery and the inverter are cooled.

There has been disclosed a technology for densely disposing an inverter and the like efficiently in an electrical unit by forming a cooling channel by disposing two heat radiation plates, which have heat radiation fins on their back surfaces, so that the back surfaces face each other and providing side wall members on sides of the heat radiation fins (see, for example, Japanese Unexamined Patent Application Publication (JP-A) No. 2007-8403).

As described in JP-A No. 2007-8403, in the electrical unit, the inverter is cooled by providing the heat radiation fins to the inverter and disposing the heat radiation fins in the cooling channel. However, depending on the volumes and the number of inverters and batteries disposed in the electrical unit, it may not be possible to dispose the inverters close to the cooling channel. Therefore, the technology has a problem in that it is difficult to cool an inverter disposed apart from the cooling channel.

SUMMARY OF THE INVENTION

It is desirable to provide an electrical unit that makes it possible to cool an inverter disposed apart from a cooling channel and that can increase flexibility in disposing the inverter.

An aspect of the present invention provides an electrical unit including a casing that contains a battery; a cooling channel that is formed in the casing, that is adjacent to the battery or a first inverter, and in which a cooling medium flows; a second inverter that is disposed in the casing apart from the cooling channel; and a heat transfer member that extends from the cooling channel or an outer wall of the cooling channel to the second inverter.

The electrical unit may further include a mid-frame that divides an inside of the casing into a first tier in which at least the battery is disposed and a second tier in which at least the second inverter is disposed.

The heat transfer member may be a part of the mid-frame.

The heat transfer member may be independent from the mid-frame and may be made of a material having a thermal conductivity higher than a thermal conductivity of the mid-frame.

The heat transfer member may include a separation portion between one end thereof close to the cooling channel and the other end thereof close to the second inverter, the separation portion being apart from the mid-frame.

The first tier and the second tier may be stacked in a vertical direction and any portion of the battery is disposed apart from a position directly below the heat transfer member in a horizontal direction.

The electrical unit may further include a converter that is disposed adjacent to the cooling channel as with the first inverter and that is disposed side by side with the first inverter, and the heat transfer member may extend from a part of the cooling channel between the first inverter and the converter to the second inverter.

The electrical unit may further include a first fin that is disposed on the first inverter and that protrudes from a body of the first inverter into the cooling channel, and a second fin that is disposed on the converter and that protrudes from a body of the converter into the cooling channel; and a gap between the first fin and the second fin may be larger than a gap between the body of the first inverter and the body of the converter.

DETAILED DESCRIPTION

Hereinafter, an example of the present invention will be described with reference to the drawings. Dimensions, materials, specific numbers, and the like in the example are only used to facilitate understanding of the invention and do not limit the present invention unless otherwise noted. In the present specification and drawings, elements that have substantially the same function and structure will be denoted by the same numerals and redundant descriptions of such elements will be omitted, and illustrations of elements that are not directly related to the present invention will be omitted.

Figure 1:
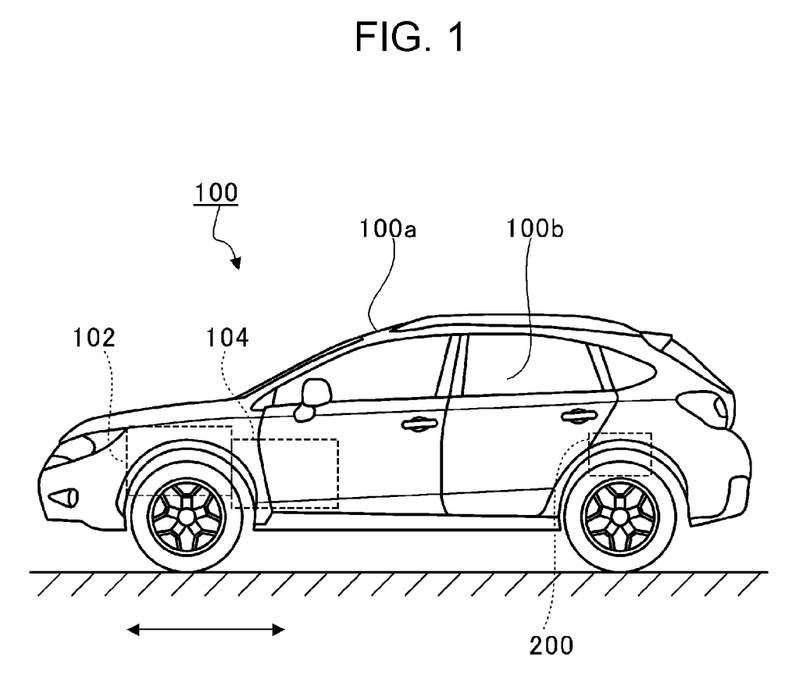
FIG. 1 is a side view of a vehicle.

FIG. 1 is a side view of a vehicle 100. The vehicle 100 is, for example, a hybrid vehicle including an engine 102 and a motor 104 as drive sources. As illustrated in FIG. 1, the engine 102, the motor 104, and a battery unit (electrical unit) 200 are mounted in the vehicle 100. The engine 102 is disposed in a front portion of a vehicle body 100a in the front-back direction (shown by a double-headed arrow in FIG. 1) and the motor 104 is disposed behind the motor 104. The battery unit 200 is disposed in a back portion of the vehicle body 100a.

Drive modes of the vehicle 100 include a motor-drive mode, in which the vehicle 100 is driven primarily by the motor 104 and secondarily by the engine 102 when the state-of-charge of the battery is sufficiently high, and a motor-engine-drive mode, in which the vehicle 100 is driven by both of the motor 104 and the engine 102 when the state-of-charge of the battery is low.

For example, the drive mode of the vehicle 100 is selected in accordance with the state-of-charge of the battery mounted in the battery unit 200. When the motor-engine-drive mode is selected, the driving states of the engine 102 and the motor 104 are switched in accordance with driving conditions, thereby enabling increase in energy efficiency and reduction in exhaust gases, such as $CO_2$.

The battery unit 200 is disposed below a trunk behind a passenger compartment 100b. The battery unit 200 is located behind the motor 104 in the front-back direction of the vehicle body 100a (the left-right direction in FIG. 1).

Figure 2:
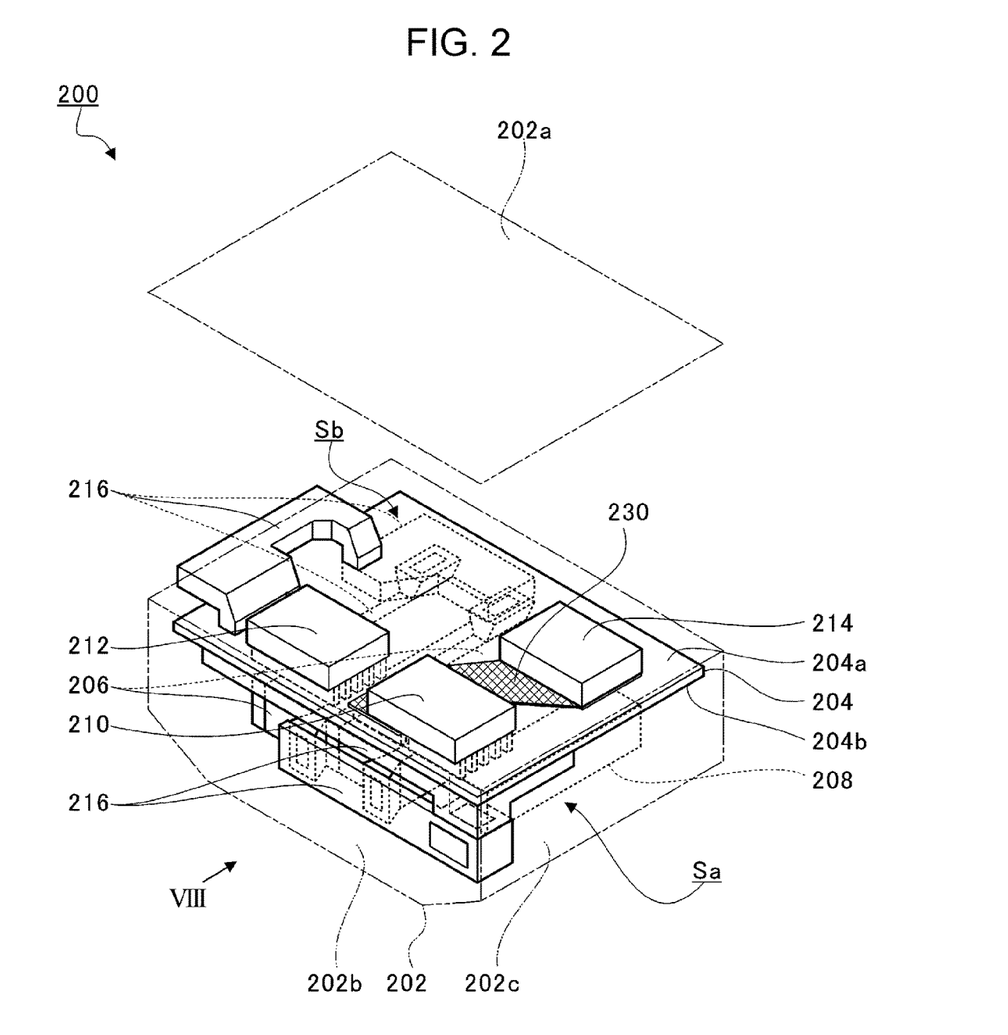
FIG. 2 is a perspective view of a battery unit.

FIG. 2 is a perspective view of the battery unit 200. In FIG. 2, a casing 202 of the battery unit 200 is indicated by an alternate long and two short dash line, and an upper lid 202a of the casing 202 is open. In the following figures, illustrations of wires and terminals will be omitted to facilitate understanding. As illustrated in FIG. 2, the casing 202 contains a mid-frame 204, two batteries 206, a junction unit 208, a first inverter 210, a converter 212, and a second inverter 214.

In FIG. 2, the up-down direction is substantially the vertical direction. The downward direction in FIG. 2 is downward in the height direction of the vehicle body 100a, and the upward direction in FIG. 2 is upward in the height direction of the vehicle body 100a. A bottom surface and the upper lid 202a of the battery unit 200 extend substantially in the horizontal direction. Side surfaces of the casing 202 include two longitudinal surfaces 202b that face each other and two transversal surfaces 202c that face each other. The longitudinal surfaces 202b and the transversal surfaces 202c are alternately disposed. The length of the transversal surfaces 202c in the horizontal direction is smaller than that of the longitudinal surfaces 202b.

The mid-frame 204 is, for example, a flat plate that extends substantially parallel to the bottom surface and the upper lid 202a of the casing 202. The mid-frame 204 has through-holes 204c, 204d, and 204e (see FIG. 3) that extend through the mid-frame 204 from an upper surface 204a to a lower surface 204b.

The mid-frame 204 divides the inside of the casing 202 into a first tier Sa and a second tier Sb. The first tier Sa and the second tier Sb are spaces that are stacked in the vertical direction. The first tier Sa is located below the second tier Sb.

The batteries 206 and the junction unit 208 are disposed in the first tier Sa. The batteries 206 each have, for example, a rectangular-parallelepiped shape. The two batteries 206 are disposed side by side so that long sides thereof are arranged parallel to each other. The long sides of the batteries 206 are parallel to the transversal surfaces 202c of the casing 202.

The junction unit 208 includes a busbar, a fuse, a relay, and the like and is coupled to the batteries 206. In FIG. 2, the outer shape of the junction unit 208 is simplified and illustrated as a rectangular parallelepiped. A terminal block (not illustrated) is disposed on an upper surface of the junction unit 208. The terminal block is exposed to the second tier Sb through a through-hole (not illustrated) formed in the mid-frame 204. The first inverter 210, the converter 212, and the second inverter 214 are coupled to the terminal block of the mid-frame 204. The batteries 206 are coupled to the first inverter 210, the converter 212, and the second inverter 214 through the junction unit 208.

The two batteries 206 are disposed in such way that the longitudinal direction thereof is parallel to the junction unit 208. Both of the two batteries 206 are disposed on one side (here, on the back side in FIG. 2) of the junction unit 208. That is, in FIG. 2, the two batteries 206 and the junction unit 208 are arranged in this order from the back side.

The first inverter 210, the converter 212, and the second inverter 214 are disposed in the second tier Sb. When the motor 104 is driven, the first inverter 210 converts direct-current electric power of the batteries 206 into alternate-current electric power. The converter 212 reduces the voltage of the alternate-current electric power output from the first inverter 210 and supplies the alternate-current electric power to the motor 104.

When charging the batteries 206 by using regenerative electric power that is generated when the vehicle 100 is braked, the motor 104 functions as a generator. The converter 212 increases the voltage of the regenerative electric power output from the motor 104, and the first inverter 210 converts the alternate-current electric power output from the converter 212 into direct-current electric power to charge the batteries 206.

The second inverter 214 is an electrical oil pump (EOP) inverter and coupled to an electric oil pump (EOP) (not illustrated) mounted in the vehicle 100. For example, when the vehicle 100 is idling, the second inverter 214 converts direct-current electric power of the batteries 206 into alternate-current electric power and supplies the alternate-current electric power to the electric oil pump to drive the electric oil pump. The electric oil pump increases the pressure of oil and pumps the oil, thereby supplying hydraulic pressure that is needed by, for example, a CVT.

The first inverter 210, the converter 212, and the second inverter 214 each have a substantially rectangular parallelepiped shape. The first inverter 210 and the converter 212 are disposed in series so that the longitudinal directions thereof are parallel to the longitudinal surfaces 202b of the casing 202. The second inverter 214 is disposed in the transversal direction of the first inverter 210 in such a way that the longitudinal direction thereof is parallel to the longitudinal surfaces 202b of the casing 202.

A plurality of ducts 216 are coupled to each other and disposed in the casing 202. A cooling channel, in which air (cooling medium) flows, is formed in the ducts 216. The batteries 206, the first inverter 210, the converter 212, and the second inverter 214 are cooled by air that flows in the cooling channel. Hereinafter, cooling of the batteries 206, the first inverter 210, the converter 212, and the second inverter 214 will be described in detail.

Figure 3:
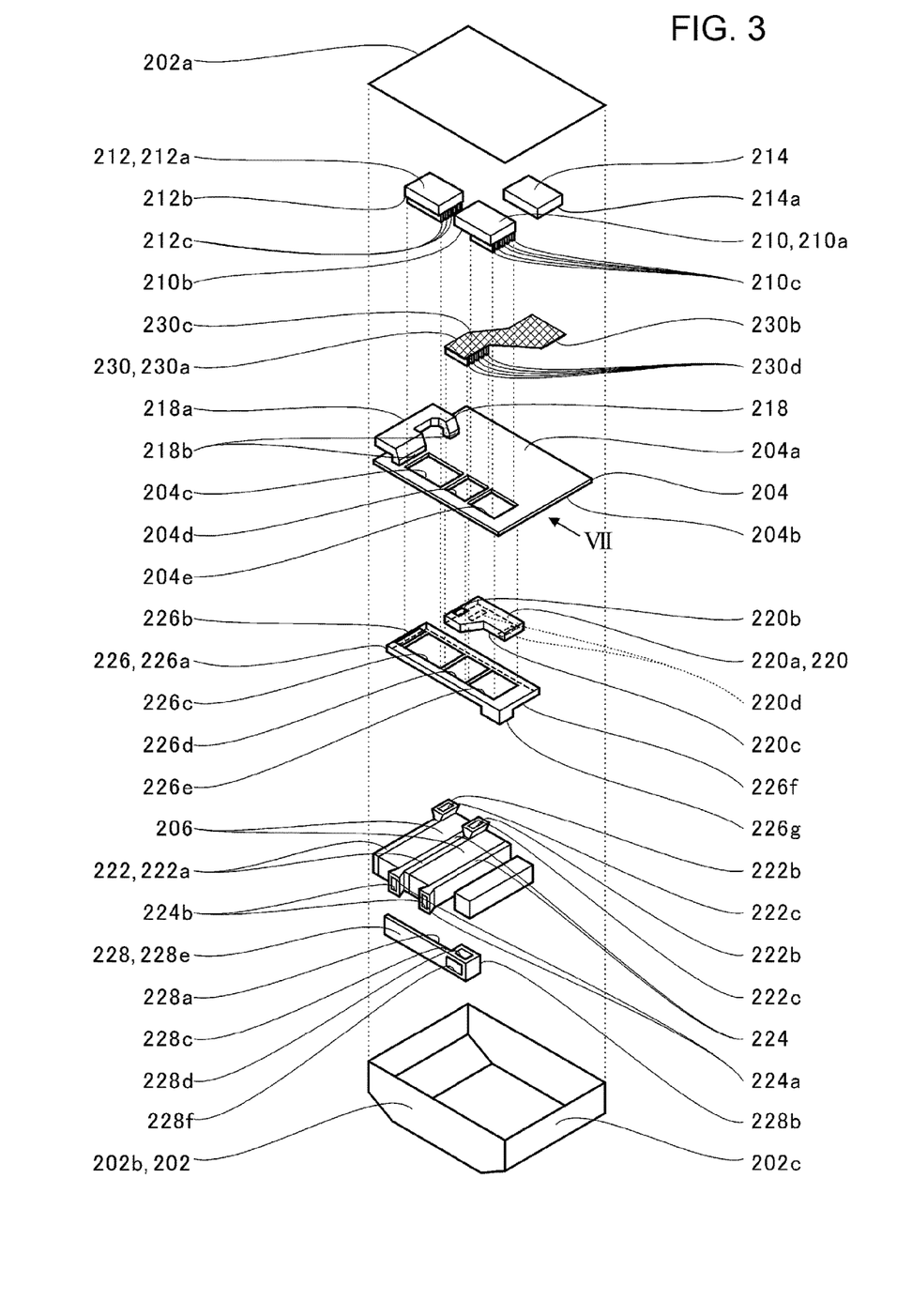
FIG. 3 is an exploded perspective view of the battery unit.

FIG. 3 is an exploded perspective view of the battery unit 200. As illustrated in FIG. 3, the ducts 216 include an intake separation duct 218, a battery intake separation duct 220, battery intake ducts 222, battery exhaust ducts 224, a power-electronics cooling duct 226, and an exhaust collection duct 228. The plurality of ducts 216 are coupled to each other, and a cooling airflow passage is formed in the ducts 216.

Figure 4:
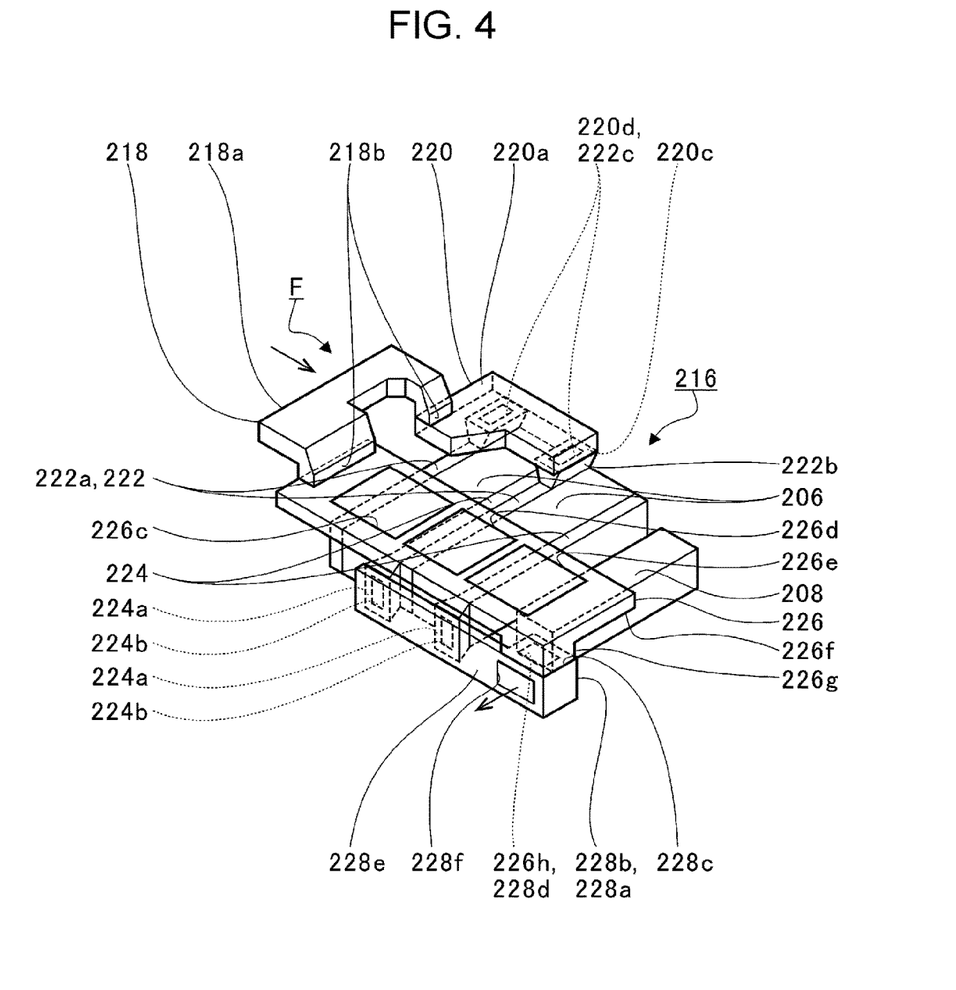
FIG. 4 is a perspective view of a plurality of ducts that are coupled to each other and batteries.

FIG. 4 is a perspective view of the plurality of ducts 216 that are coupled to each other and the batteries 206. First, referring to FIGS. 3 and 4, the coupling relationship among the plurality of ducts 216 will be described.

The intake separation duct 218 has an intake hole 218a, and the intake hole 218a communicates with the outside of the casing 202. The intake separation duct 218 branches into two branch pipes 218b. Each of the branch pipes 218b is inserted through a corresponding one of through-holes (not illustrated) formed in the upper surface 204a of the mid-frame 204.

The battery intake separation duct 220 is disposed on the lower surface 204b of the mid-frame 204. An opening 220b that faces a corresponding one of the branch pipes 218b is formed in an upper surface 220a of the battery intake separation duct 220. The battery intake separation duct 220 communicates with the intake separation duct 218 through the opening 220b. Two openings 220d are formed in a lower surface 220c of the battery intake separation duct 220.

The battery intake ducts 222 and the battery exhaust ducts 224 each have a substantially rectangular parallelepiped shape and are disposed side by side with the batteries 206 below the battery intake separation duct 220. Each of the battery intake ducts 222 is disposed on a side of a corresponding one of the batteries 206, the side facing away from the junction unit 208.

A projection 222b is formed on an upper surface 222a of one end portion of each of the battery intake ducts 222 in the longitudinal direction. The projection 222b has an opening 222c. Each of the openings 222c of the two battery intake ducts 222 is coupled to a corresponding one of the openings 220d of the battery intake separation duct 220. The battery intake ducts 222 communicate with the insides of the adjacent batteries 206.

Each of the battery exhaust ducts 224 is disposed on a side of a corresponding one of the batteries 206, the side facing toward the junction unit 208. End surfaces 224a at ends of the battery exhaust ducts 224 opposite to the projections 222b of the battery intake ducts 222 protrude from the batteries 206 and the battery intake ducts 222. The protruding portions of the battery exhaust ducts 224 are tapered in such a way that that protruding portions expand toward the end surfaces 224a in the direction in which the two battery exhaust ducts 224 are arranged. The end surfaces 224a of the battery exhaust ducts 224 have openings 224b.

The battery exhaust ducts 224 communicate with the insides of the adjacent batteries 206. Air that has flowed into the batteries 206 from the battery intake ducts 222 flows through the battery exhaust ducts 224 and flows out from the openings 224b.

The power-electronics cooling duct 226 has a substantially rectangular parallelepiped shape and is disposed side by side with the battery intake separation duct 220 on the lower surface 204b of the mid-frame 204. The longitudinal direction of the power-electronics cooling duct 226 is parallel to the direction in which the two batteries 206 are arranged.

An opening 226b, which faces one of the branch pipes 218b, is formed in one end portion of an upper surface 226a of the power-electronics cooling duct 226, the end portion being away from the junction unit 208. The power-electronics cooling duct 226 communicates with the intake separation duct 218 through the opening 226b. Openings 226c, 226d, and 226e are formed in the upper surface 226a at positions that are closer than the opening 226b to the other end portion of the upper surface 226a (to the junction unit 208). The openings 226c, 226d, and 226e are disposed side by side in the direction in which the batteries 206 are arranged and respectively face the through-holes 204c, 204d, and 204e of the mid-frame 204. A projection 226g is formed on the other end portion of a lower surface 226f of the power-electronics cooling duct 226. The projection 226g has an opening 226h.

The exhaust collection duct 228 is disposed side by side with the batteries 206, the battery intake ducts 222, and the battery exhaust ducts 224. The longitudinal direction of the exhaust collection duct 228 is parallel to the direction in which the batteries 206 are arranged. The exhaust collection duct 228 has a facing surface 228a that faces the end surfaces 224a of the two battery exhaust ducts 224. Two openings (not illustrated) that face the openings 224b of the two battery exhaust ducts 224 are formed in the facing surface 228a, and the exhaust collection duct 228 communicates with the battery exhaust ducts 224.

A projection 228b is formed on one end portion of the facing surface 228a of the exhaust collection duct 228, the one end portion being close to the junction unit 208. An opening 228d is formed in an upper surface 228c of the projection 228b, and the opening 228d of the exhaust collection duct 228 and the opening 226h of the power-electronics cooling duct 226 are coupled to each other. An exhaust hole 228f is formed in a side surface 228e of the exhaust collection duct 228 opposite to the facing surface 228a.

The plurality of ducts 216 are coupled to each other as described above, and a cooling airflow passage F is formed in the plurality of ducts 216. An air suction fan (not illustrated) is disposed in a portion of the casing 202 close to the side surface 228e of the exhaust collection duct 228. The air suction fan sucks air from the cooling airflow passage F through the exhaust hole 228f. As a result, air is sucked from the outside of the casing 202 through the intake hole 218a of the battery intake separation duct 220; the air passes through the cooling airflow passage F and is discharged from the exhaust hole 228f of the exhaust collection duct 228; and the air is discharged to the outside of the casing 202 through the air suction fan.

Figure 5:
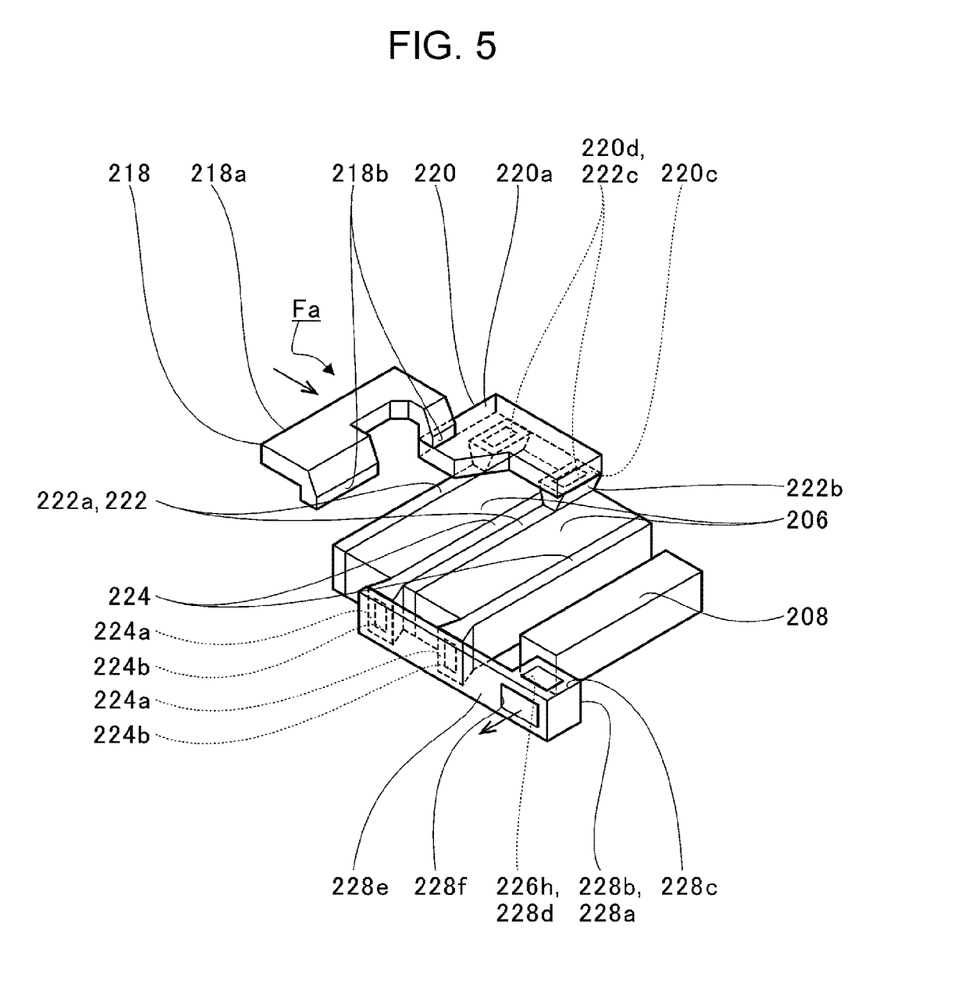
FIG. 5 illustrates a first cooling channel of a cooling airflow passage.
Figure 6:
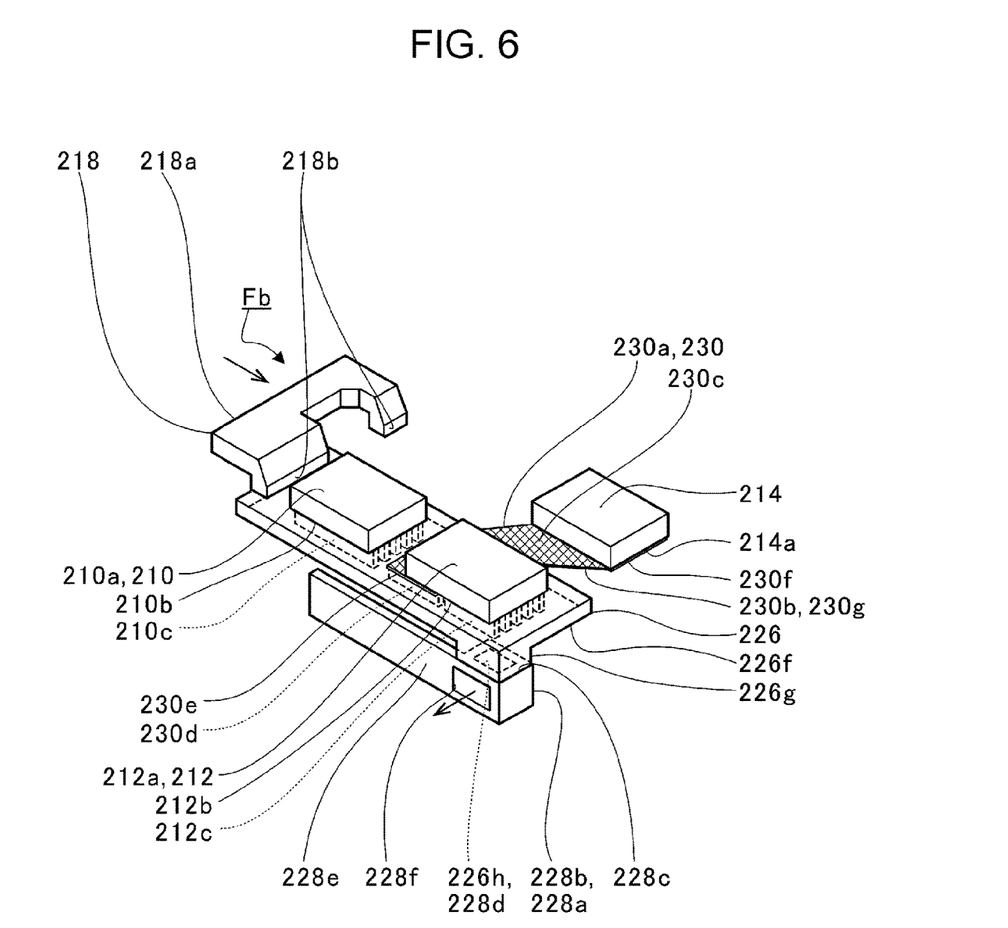
FIG. 6 illustrates a second cooling channel (cooling channel) of the cooling airflow passage.

The intake separation duct 218 divides the cooling airflow passage F into two channels. Referring to FIGS. 5 and 6, the two channels of the cooling airflow passage F will be described.

FIG. 5 illustrates a first cooling channel Fa of the cooling airflow passage F. As illustrated in FIG. 5, the first cooling channel Fa is constituted by the intake separation duct 218, the battery intake separation duct 220, the battery intake ducts 222, the batteries 206, the battery exhaust ducts 224, and the exhaust collection duct 228.

A part of air that has been sucked into the intake separation duct 218 from the intake hole 218a flows from the battery intake separation duct 220 into the two battery intake ducts 222. The air that has flowed into the two battery intake ducts 222 passes through the insides of the batteries 206 adjacent to the battery intake ducts 222, flows through the battery exhaust ducts 224 adjacent to the batteries 206, and flows out to the exhaust collection duct 228. The air that has flowed out to the exhaust collection duct 228 is led to the exhaust hole 228f of the exhaust collection duct 228. Thus, in the first cooling channel Fa, air flows through the batteries 206, and the batteries 206 are cooled.

FIG. 6 illustrates a second cooling channel (cooling channel) Fb of the cooling airflow passage F. As illustrated in FIG. 6, the second cooling channel Fb is constituted by the intake separation duct 218, the power-electronics cooling duct 226, and the exhaust collection duct 228.

A part of air that has been sucked into the intake separation duct 218 from the intake hole 218a flows into the power-electronics cooling duct 226. The air that has flowed into the power-electronics cooling duct 226 flows out to the exhaust collection duct 228 and is led to the exhaust hole 228f of the exhaust collection duct 228.

Fins 210c (first fin) are disposed on a lower surface 210b of a body 210a of the first inverter 210. The fins 210c extend in a direction parallel to the airflow direction in the power-electronics cooling duct 226. That is, the fins 210c extend in a direction from one end toward the other end of the power-electronics cooling duct 226. The fins 210c face each other in a direction perpendicular to the airflow in the power-electronics cooling duct 226. The fins 210c increase the contact area of the first inverter 210 with air, thereby efficiently cooling the first inverter 210.

Likewise, fins 212c (second fin) are disposed on a lower surface 212b of a body 212a of the converter 212. The fins 212c extend in a direction parallel to the airflow direction in the power-electronics cooling duct 226. That is, the fins 212c extend in the direction from one end toward the other end of the power-electronics cooling duct 226. The fins 212c face each other in the direction perpendicular to the airflow in the power-electronics cooling duct 226. The fins 212c increase the contact area of the converter 212 with air, thereby efficiently cooling the converter 212.

As described above, the mid-frame 204 has the through-holes 204c, 204d, and 204e; and the power-electronics cooling duct 226 has the openings 226c, 226d, and 226e (see FIG. 3). The body 212a of the converter 212 blocks the through-hole 204c (the opening 226c). The fins 212c extend through the through-hole 204c and protrude from the opening 226c to the inside (the second cooling channel Fb) of the power-electronics cooling duct 226. The body 210a of the first inverter 210 blocks the through-hole 204e (the opening 226e). The fins 210c extend through the through-hole 204e and protrude from the opening 226e to the inside of the power-electronics cooling duct 226.

In the second cooling channel Fb, air flowing in the power-electronics cooling duct 226 cools the fins 210c and 212c. As a result, the first inverter 210 and the converter 212 are cooled.

Thus, the first cooling channel Fa and the second cooling channel Fb are formed side by side in the battery unit 200. The first cooling channel Fa cools the batteries 206; and the second cooling channel Fb cools so-called power electronic devices, such as the first inverter 210, the converter 212, and the second inverter 214. Therefore, it is possible to independently design the channel widths of the first cooling channel Fa and the second cooling channel Fb so that cooling air for cooling to the batteries 206 and cooling air for cooling the power electronic devices flow with optimal flow rates.

As described above, the battery unit 200 includes the mid-frame 204; the batteries 206, having a large volume, are disposed in the first tier Sa; and the first inverter 210, the converter 212, and the second inverter 214 (power electronic devices) are disposed in the second tier Sb. Therefore, it is possible to efficiently dispose these components by stacking the components in the vertical direction while maintaining the area of the battery unit 200 in the horizontal direction to be small.

Accordingly, it is possible to dispose the second inverter 214, which has been independently disposed outside of the battery unit 200 with existing technologies, in the casing 202 of the battery unit 200. The casing 202, for containing the first inverter 210 and the converter 212, is designed so as to be resistant to electromagnetic noise. Therefore, it is not necessary to magnetically shield the second inverter 214 independently, and it is possible to achieve cost reduction.

However, if the second inverter 214 were arranged in series with the first inverter 210 and the converter 212, the length of the longitudinal surfaces 202b of the battery unit 200 (see FIG. 2) in the longitudinal direction would increase, and the size of the battery unit 200 would increase.

To avoid such increase in the size of the battery unit 200, the second inverter 214 is disposed side by side with the first inverter 210 and the converter 212.

As a result, the second inverter 214 is disposed apart from the second cooling channel Fb (the power-electronics cooling duct 226). Therefore, it is difficult to cool the second inverter 214 by bringing the second inverter 214 into direct contact with the second cooling channel Fb. For example, it might be possible to extend the second cooling channel Fb to a position directly below the second inverter 214. In this case, however, the junction unit 208, which has a more complex shape than illustrated, would interfere with other components, and therefore it is not possible to dispose a duct directly below the second inverter 214.

For this reason, a heat transfer member 230 is disposed in the casing 202. The heat transfer member 230 is independent from the mid-frame 204 and made of a material having a thermal conductivity higher than the thermal conductivity of the mid-frame 204. For example, the mid-frame 204 is made of a resin and the heat transfer member 230 is made of a metal; or the mid-frame 204 is made of aluminum and the heat transfer member 230 is made of a metal including copper.

The heat transfer member 230 includes a body 230a having, for example, a flat plate-like shape that is thinner than the mid-frame 204. The body 230a is disposed on the upper surface 204a of the mid-frame 204 (see FIG. 3). A lower surface 230b of one end portion of the body 230a blocks the through-hole 204d of the mid-frame 204 (the opening 226d of the power-electronics cooling duct 226), and an upper surface 230c of the other end portion of the body 230a is in contact with a lower surface 214a of the second inverter 214.

Fins 230d are disposed on the lower surface 230b of the one end portion of the body 230a. As with the fins 210c and 212c described above, the fins 230d extend parallel to the airflow direction of the power-electronics cooling duct 226. That is, the fins 230d extend in the direction from one end toward the other end of the power-electronics cooling duct 226. The fins 230d face each other in the direction perpendicular to the airflow in the power-electronics cooling duct 226.

The fins 230d of the heat transfer member 230 extend through the through-hole 204d of the mid-frame 204 and protrude from the opening 226e of the power-electronics cooling duct 226 to the inside of the power-electronics cooling duct 226. Therefore, in the second cooling channel Fb, air flowing in the power-electronics cooling duct 226 cools the fins 230d. As a result, the first inverter 210, the converter 212, and the second inverter 214 are cooled.

Thus, in the battery unit 200, it is possible to cool the second inverter 214, although the second inverter 214 is disposed apart from the second cooling channel Fb. Therefore, it is possible to increase flexibility in disposing the second inverter 214.

The heat transfer member 230 extends from a part of the power-electronics cooling duct 226 (second cooling channel Fb) between the first inverter 210 and the converter 212 to the second inverter 214. Since both of the converter 212 and the second inverter 214 generate heat, a gap is provided between the converter 212 and the second inverter 214. One end 230e of the heat transfer member 230 is disposed in this gap, and therefore it is not necessary to extend the power-electronics cooling duct 226 in the longitudinal direction in order to dispose the one end 230e.

Thus, by locating the one end 230e of the heat transfer member 230 between the first inverter 210 and the converter 212, it is possible to efficiently use the space in the casing 202.

Figure 7:
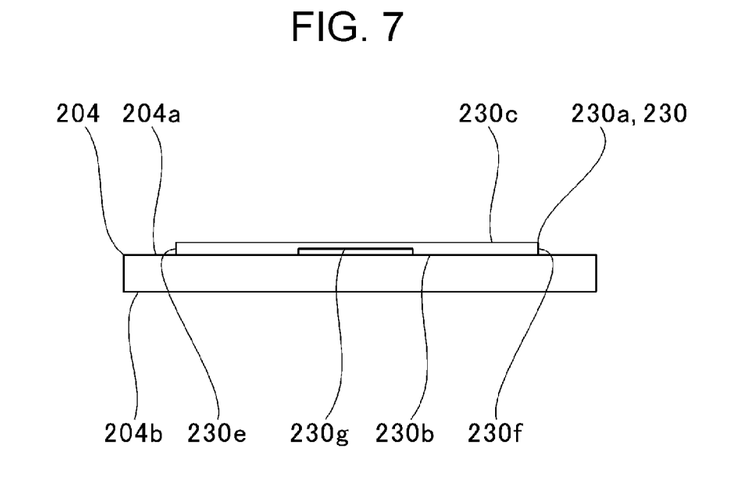
FIG. 7 illustrates a mid-frame to which a heat transfer member is attached, viewed in the direction of arrow VII in FIG. 3.

FIG. 7 illustrates the mid-frame 204 to which the heat transfer member 230 is attached, viewed in the direction of arrow VII in FIG. 3. As illustrated in FIG. 7, a separation portion 230g is formed in the lower surface 230b the body 230a of the heat transfer member 230 between the one end 230e on the left side in FIG. 7 (close to the second cooling channel Fb) and the other end 230f on the right side in FIG. 7 (close to the second inverter 214).

The separation portion 230g is recessed from a portion of the lower surface 230b of the body 230a close to the one end 230e and from a portion of the lower surface 230b close to the other end 230f, and the separation portion 230g is apart from the mid-frame 204. That is, the separation portion 230g forms a space between the body 230a and the mid-frame 204.

Thus, by forming the separation portion 230g, heat transfer between the heat transfer member 230 and the mid-frame 204 is suppressed. Therefore, heat generated by the second inverter 214 can be easily transferred toward the one end 230e without being diffused to the mid-frame 204, and it is possible to perform efficient cooling in the second cooling channel Fb.

Figure 8:
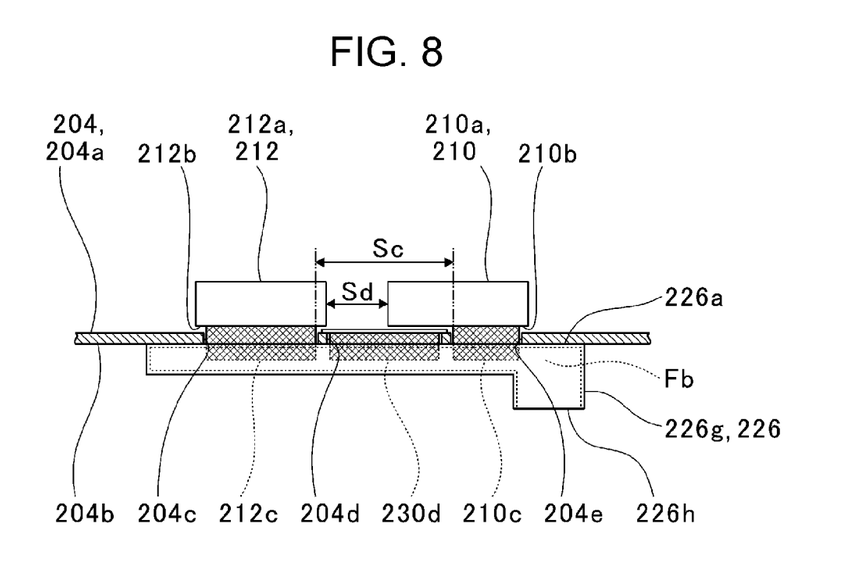
FIG. 8 illustrates a converter, a first inverter, the mid-frame, and a power-electronics cooling duct, viewed in the direction of arrow VIII in FIG. 2.

FIG. 8 illustrates the converter 212, the first inverter 210, the mid-frame 204, and the power-electronics cooling duct 226, viewed in the direction of arrow VIII in FIG. 2. In FIG. 8, the mid-frame 204 is illustrated by using a sectional surface passing through the through-holes 204c, 204d, and 204e to facilitate understanding. The fins 210c, 212c, 230d are indicated by cross hatching.

The amount of heat generated by the first inverter 210 is smaller than that of the converter 212. Therefore, as illustrated in FIG. 8, the length of the fins 210c of the first inverter 210 in the flow direction of the second cooling channel Fb is smaller than that of the fins 212c of the converter 212.

The body 210a of the first inverter 210 extends longer than the fins 210c of the first inverter 210 in the flow direction of the second cooling channel Fb (the left-right direction in FIG. 8). A gap Sc between the fins 210c of the first inverter 210 and the fins 212c of the converter 212 is larger than a gap Sd between the body 210a of the first inverter 210 and the body 212a of the converter 212.

The one end 230e of the body 230a of the heat transfer member 230 and the fins 230d are disposed in the gap Sc. Therefore, the size of the fins 230d of the heat transfer member 230 can be increased by the length of the gap Sd, and it is possible to increase the cooling efficiency of the heat transfer member 230 in cooling the second inverter 214 by efficiently using the space in the casing 202.

Figure 9:
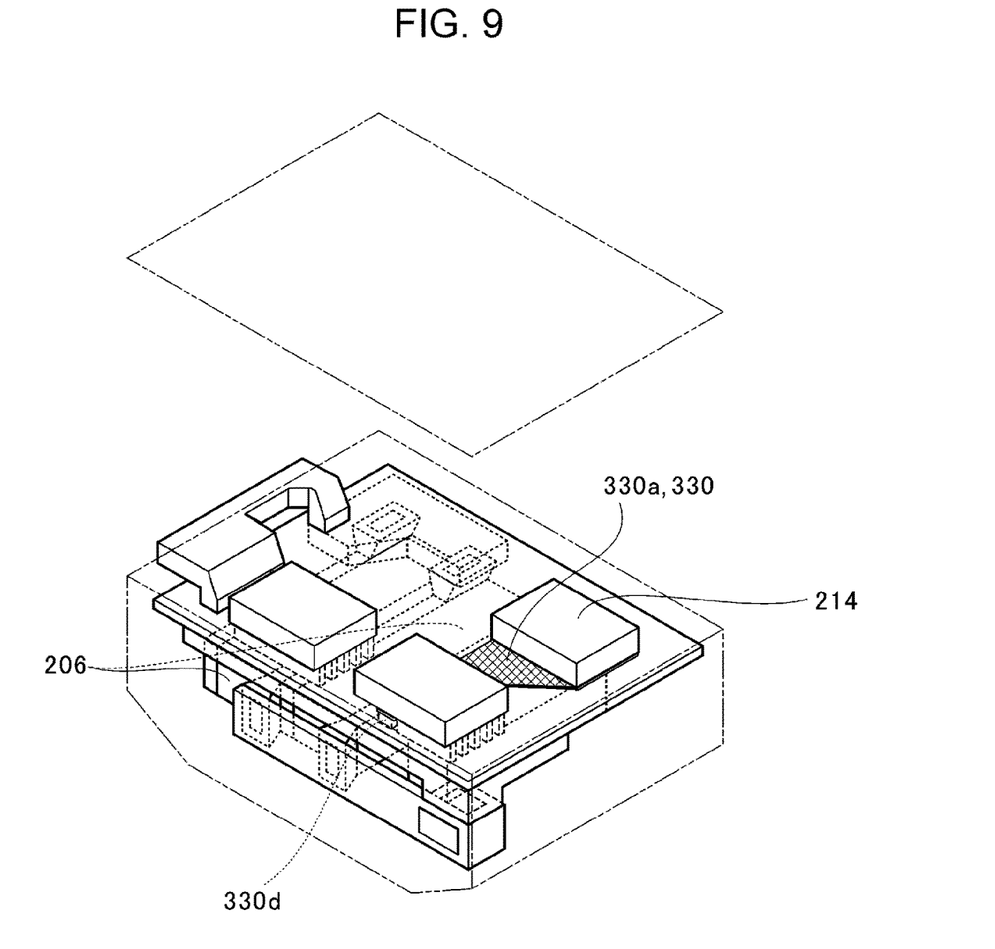
FIG. 9 illustrates a first modification.

FIG. 9 illustrates a first modification. As illustrated in FIG. 9, in the first modification, both of a body 330a and fins 330d of a heat transfer member 330 are disposed so as to be displaced in the horizontal direction from a position directly above the two batteries 206. That is, any portion of the two batteries 206 is disposed apart from a position directly below the heat transfer member 330 in the horizontal direction.

As heat is transferred from the second inverter 214, the temperature of the heat transfer member 330 tends to become higher than that of the batteries 206. Therefore, by disposing the heat transfer member 330 at a position that is not directly above the batteries 206, it is possible to protect the batteries 206 from heat of the second inverter 214. In other words, it is possible to reduce the flow rate of air in the first cooling channel Fa that is necessary to maintain the batteries 206 at an appropriate temperature.

Figure 10:
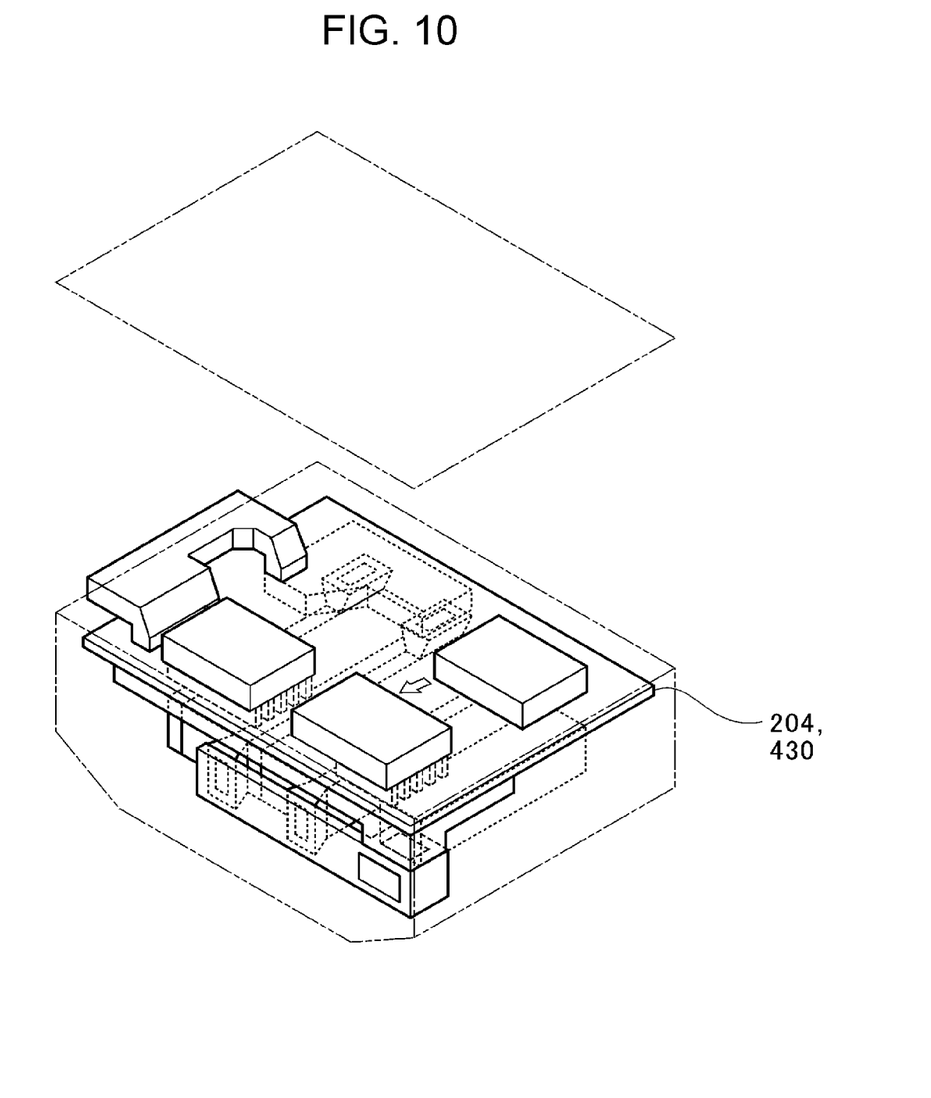
FIG. 10 illustrates a second modification.

FIG. 10 illustrates a second modification. As illustrated in FIG. 10, the second modification does not include the heat transfer members 230 and 330, which are independent from the mid-frame 204 as described above. Instead, a part of the mid-frame 204 functions as a heat transfer member 430.

That is, the heat transfer member 430 is in contact with the power-electronics cooling duct 226 (an outer wall of the second cooling channel Fb) and extends from the power-electronics cooling duct 226 to the second inverter 214. In this case, the mid-frame 204 (that is, the heat transfer member 430) is made of a metal and transfers heat of the second inverter 214 to the power-electronics cooling duct 226 (in FIG. 10, movement of heat is indicated by a blank arrow).

Thus, in the second modification, as with the example described above, it is possible to cool the second inverter 214, although the second inverter 214 is disposed apart from the second cooling channel Fb. Therefore, it is possible to increase flexibility in disposing the second inverter 214.

With the example and the modifications of the present invention, it is possible to cool the inverter that is apart from the cooling channel and to increase flexibility in disposing the inverter.

The present invention is not limited to the example and modifications, which have been described above with reference to the drawings. Various modifications and adjustments within the descriptions of the claims are included in the technical scope of the present invention.

For example, in the example and the modifications described above, the heat transfer members 230, 330, and 430 are cooled by the second cooling channel Fb that cools (that is adjacent to) the first inverter 210. However, for example, depending on the positions of the batteries 206, the heat transfer members 230, 330, and 430 may be cooled by a cooling channel that cools (that is adjacent to) the batteries 206.

In the example and the modifications described above, the inside of the casing 202 is divided by the mid-frame 204 into the first tier Sa and the second tier Sb. However, the mid-frame 204 is not essential.

In the example and first modification described above, the heat transfer members 230 and 330 each include the separation portion 230g. However, the separation portion 230g is not essential.

In the example and the first modification described above, the heat transfer members 230 and 330 extend from a part of the second cooling channel Fb between the first inverter 210 and the converter 212 to the second inverter 214. However, the heat transfer members 230 and 330 may extend from another part of the second cooling channel Fb to the second inverter 214.

In the example and the first modification described above, the gap Sc between the fins 210c of the first inverter 210 and the fins 212c of the converter 212 is larger than the gap Sd between the body 210a of the first inverter 210 and the body 212a of the converter 212. However, the gap Sd may be the same as the gap Sc, or the gap Sd may be larger than the gap Sc.

The invention claimed is:

1. An electrical unit, comprising:
a casing that contains a battery;
a first inverter disposed in the casing;
a cooling channel that is formed below the first inverter in the casing, that is adjacent to the battery, and in which a cooling medium flows;

a second inverter that is disposed in the casing apart from the cooling channel such that, in a plan view, the second inverter is placed outside of the cooling channel; and a heat transfer member that extends from the cooling channel or an outer wall of the cooling channel to the second inverter.

2. The electrical unit according to claim 1, further comprising:

a mid-frame that divides an inside of the casing into a first tier in which at least the battery is disposed and a second tier in which at least the second inverter is disposed.

3. The electrical unit according to claim 2, wherein the heat transfer member is a part of the mid-frame.

4. The electrical unit according to claim 3, further comprising:

a converter that is disposed adjacent to the cooling channel as with the first inverter and that is disposed side by side with the first inverter, wherein the heat transfer member extends from a part of the cooling channel between the first inverter and the converter to the second inverter.

5. The electrical unit according to claim 4, further comprising:

a first fin that is disposed on the first inverter and that protrudes from a body of the first inverter into the cooling channel; and a second fin that is disposed on the converter and that protrudes from a body of the converter into the cooling channel, wherein a gap between the first fin and the second fin is larger than a gap between the body of the first inverter and the body of the converter.

6. The electrical unit according to claim 2, wherein the heat transfer member is independent from the mid-frame and comprises a material having a thermal conductivity higher than a thermal conductivity of the mid-frame.

7. The electrical unit according to claim 6, wherein the heat transfer member comprises a separation portion between one end thereof close to the cooling channel and another end thereof close to the second inverter, the separation portion being apart from the mid-frame.

8. The electrical unit according to claim 7, further comprising:

a converter that is disposed adjacent to the cooling channel as with the first inverter and that is disposed side by side with the first inverter, wherein the heat transfer member extends from a part of the cooling channel between the first inverter and the converter to the second inverter.

9. The electrical unit according to claim 8, further comprising:

a first fin that is disposed on the first inverter and that protrudes from a body of the first inverter into the cooling channel; and a second fin that is disposed on the converter and that protrudes from a body of the converter into the cooling channel, wherein a gap between the first fin and the second fin is larger than a gap between the body of the first inverter and the body of the converter.

10. The electrical unit according to claim 7, wherein the first tier and the second tier are stacked in a vertical direction and each portion of the battery is disposed apart from a position directly below the heat transfer member in a horizontal direction.

11. The electrical unit according to claim 6, further comprising:

a converter that is disposed adjacent to the cooling channel as with the first inverter and that is disposed side by side with the first inverter, wherein the heat transfer member extends from a part of the cooling channel between the first inverter and the converter to the second inverter.

12. The electrical unit according to claim 11, further comprising:

a first fin that is disposed on the first inverter and that protrudes from a body of the first inverter into the cooling channel; and a second fin that is disposed on the converter and that protrudes from a body of the converter into the cooling channel, wherein a gap between the first fin and the second fin is larger than a gap between the body of the first inverter and the body of the converter.

13. The electrical unit according to claim 6, wherein the first tier and the second tier are stacked in a vertical direction and each portion of the battery is disposed apart from a position directly below the heat transfer member in a horizontal direction.

14. The electrical unit according to claim 2, further comprising:

a converter that is disposed adjacent to the cooling channel as with the first inverter and that is disposed side by side with the first inverter, wherein the heat transfer member extends from a part of the cooling channel between the first inverter and the converter to the second inverter.

15. The electrical unit according to claim 14, further comprising:

a first fin that is disposed on the first inverter and that protrudes from a body of the first inverter into the cooling channel; and a second fin that is disposed on the converter and that protrudes from a body of the converter into the cooling channel, wherein a gap between the first fin and the second fin is larger than a gap between the body of the first inverter and the body of the converter.

16. The electrical unit according to claim 2, wherein the first tier and the second tier are stacked in a vertical direction and any portion of the battery is disposed apart from a position directly below the heat transfer member in a horizontal direction.

17. The electrical unit according to claim 1, further comprising:

a converter that is disposed adjacent to the cooling channel as with the first inverter and that is disposed side by side with the first inverter, wherein the heat transfer member extends from a part of the cooling channel between the first inverter and the converter to the second inverter.

18. The electrical unit according to claim 17, further comprising:

a first fin that is disposed on the first inverter and that protrudes from a body of the first inverter into the cooling channel; and a second fin that is disposed on the converter and that protrudes from a body of the converter into the cooling channel, wherein a gap between the first fin and the second fin is larger than a gap between the body of the first inverter and the body of the converter.

19. The electrical unit according to claim 1, wherein, in the plan view, the second inverter is completely placed outside of the cooling channel, and the first inverter overlaps with the cooling channel.

20. An electrical unit, comprising:
a casing that contains a battery;
a first inverter disposed in the casing;
a cooling channel that is formed below the first inverter in the casing, that is adjacent to the first inverter, and in which a cooling medium flows;
a second inverter that is disposed in the casing apart from the cooling channel such that, in a plan view, the second inverter is placed outside of the cooling channel; and
a heat transfer member that extends from the cooling channel to the second inverter.

* * * * *